United States Patent
Khamashta et al.

(10) Patent No.: US 9,768,772 B1
(45) Date of Patent: Sep. 19, 2017

(54) POLARITY ADAPTIVE POWER SOURCE APPARATUS

(71) Applicant: AMAZON TECHNOLOGIES, INC., Reno, NV (US)

(72) Inventors: Robert Khamashta, Campbell, CA (US); Daniel David Hershey, Los Gatos, CA (US); Jason Evans Goulden, Los Gatos, CA (US); Shelomon Patrick Doblack, Santa Clara, CA (US); Manuel Rinley Deeds, III, San Jose, CA (US); Hsueh Jang Su, Pleasanton, CA (US); Mi Zhou, Santa Clara, CA (US); Colter Earl Cederlof, San Jose, CA (US)

(73) Assignee: Amazon Technologies, Inc., Reno, NV (US)

( * ) Notice: Subject to any disclaimer, the term of this patent is extended or adjusted under 35 U.S.C. 154(b) by 424 days.

(21) Appl. No.: 14/460,049

(22) Filed: Aug. 14, 2014

(51) Int. Cl.
| | |
|---|---|
| *H01H 19/64* | (2006.01) |
| *H01H 31/10* | (2006.01) |
| *H01H 33/52* | (2006.01) |
| *H01H 33/59* | (2006.01) |
| *H01H 47/00* | (2006.01) |
| *H01H 85/46* | (2006.01) |
| *H03K 17/94* | (2006.01) |
| *H03K 17/687* | (2006.01) |

(52) U.S. Cl.
CPC ......... *H03K 17/94* (2013.01); *H03K 17/6871* (2013.01)

(58) Field of Classification Search
CPC .......... H03K 17/687; H03K 17/04123; H03K 17/102; H03K 17/122; H03K 17/6871; H03K 17/693; H03K 17/955; H03K 17/00; H03K 17/06; H03K 17/145; H03K 17/223; H03K 17/56; H03K 17/567; H03K 2217/0036
See application file for complete search history.

(56) References Cited

U.S. PATENT DOCUMENTS

| | | | | |
|---|---|---|---|---|
| 3,919,951 | A | * 11/1975 | Williams | ............. A01C 23/025 111/123 |
| 4,423,456 | A | * 12/1983 | Zaidenweber | ....... H02H 11/003 307/127 |
| 7,527,893 | B2 | 5/2009 | Larsen | |

(Continued)

OTHER PUBLICATIONS

"Instaload", Microsoft, [online], [retrieved on Sep. 2, 2014]. Retrieved from the Internet <URL:download.microsoft.com/download/D/8/5/D85E2240-8688-4D49-BFD3-763E61A7D90E/InstaLoadBrochure.pdf>.

(Continued)

*Primary Examiner* — Jared Fureman
*Assistant Examiner* — Esayas Yeshaw
(74) *Attorney, Agent, or Firm* — Lindauer Law, PLLC

(57) ABSTRACT

Described are devices for automatically adapting electrical polarity from a power source to a specified output polarity for use by an electrical load. In one implementation, power adaptation circuitry comprising one or more bridge circuits accept electrical power of unspecified polarity and output specified polarity. The bridge circuit may comprise a plurality of field-effect transistors (FETs) configured such that a particular subset of the FETs are energized to conduct electric current to the outputs when a particular polarity is applied at inputs.

20 Claims, 6 Drawing Sheets

(56) References Cited

U.S. PATENT DOCUMENTS

| | | | |
|---|---|---|---|
| 7,656,126 B2 * | 2/2010 | Sato | H02J 7/0026 320/134 |
| 7,764,045 B2 | 7/2010 | Hoffman et al. | |
| 8,461,723 B2 * | 6/2013 | Kojima | H02M 7/53871 307/104 |
| 8,654,549 B2 * | 2/2014 | Janning | H02J 7/0034 320/116 |
| 9,124,097 B2 * | 9/2015 | Cruz | H02H 11/002 |
| 2008/0084214 A1 | 4/2008 | Hoffman et al. | |
| 2008/0116751 A1 * | 5/2008 | Kihara | H03K 17/6874 307/113 |
| 2010/0164457 A1 * | 7/2010 | Al-Shyoukh | H03F 3/2173 323/284 |
| 2011/0162946 A1 * | 7/2011 | Altonen | H01H 13/023 200/33 R |
| 2012/0299386 A1 * | 11/2012 | Kaufman | H02J 1/12 307/82 |
| 2013/0115895 A1 * | 5/2013 | Crandall | H01L 27/1211 455/73 |
| 2013/0249429 A1 * | 9/2013 | Woytowitz | H05B 37/0209 315/246 |
| 2014/0002012 A1 * | 1/2014 | McCauley | H02J 7/025 320/108 |

OTHER PUBLICATIONS

"Microsoft IP Licensing: InstaLoad Battery Installation Technology Overview", Microsoft, Hardware, retrieved on Sep. 2, 2014 at <http://www.microsoft.com/hardware/en-us/support/licensing-instaload-overview>, 3 pgs.

* cited by examiner

POLARITY ADAPTIVE POWER SOURCE APPARATUS

BACKGROUND

Devices such as remote controls, portable entertainment devices, flashlights, computers, electric cars, and so forth, have electrical circuits that use electrical power to operate. Electrical power may be provided by a power source, such as a primary battery, secondary battery, fuel cell, photovoltaic generator, thermoelectric generator, and so forth. The power source exhibits a polarity, that is, a positive and a negative output between which an electric current may flow to transfer the electrical power.

The circuits within the device are designed for operation with electrical power of a particular polarity. Application of incorrect polarity to the circuit may result in the circuit not operating, damage to the circuit, or even potentially harm to a user. For example, putting batteries into a defibrillator backwards may result in the device not operating. In another example, misconnecting a charger for an electric car could result in a serious injury. As a result, it would be advantageous for users to be able to install or connect a power source to a device without regard to the polarity of the power source while still providing for operation of the circuits in the device.

BRIEF DESCRIPTION OF FIGURES

The detailed description is set forth with reference to the accompanying figures. In the figures, the left-most digit(s) of a reference number identifies the figure in which the reference number first appears. The use of the same reference numbers in different figures indicates similar or identical items or features.

Figure 1:
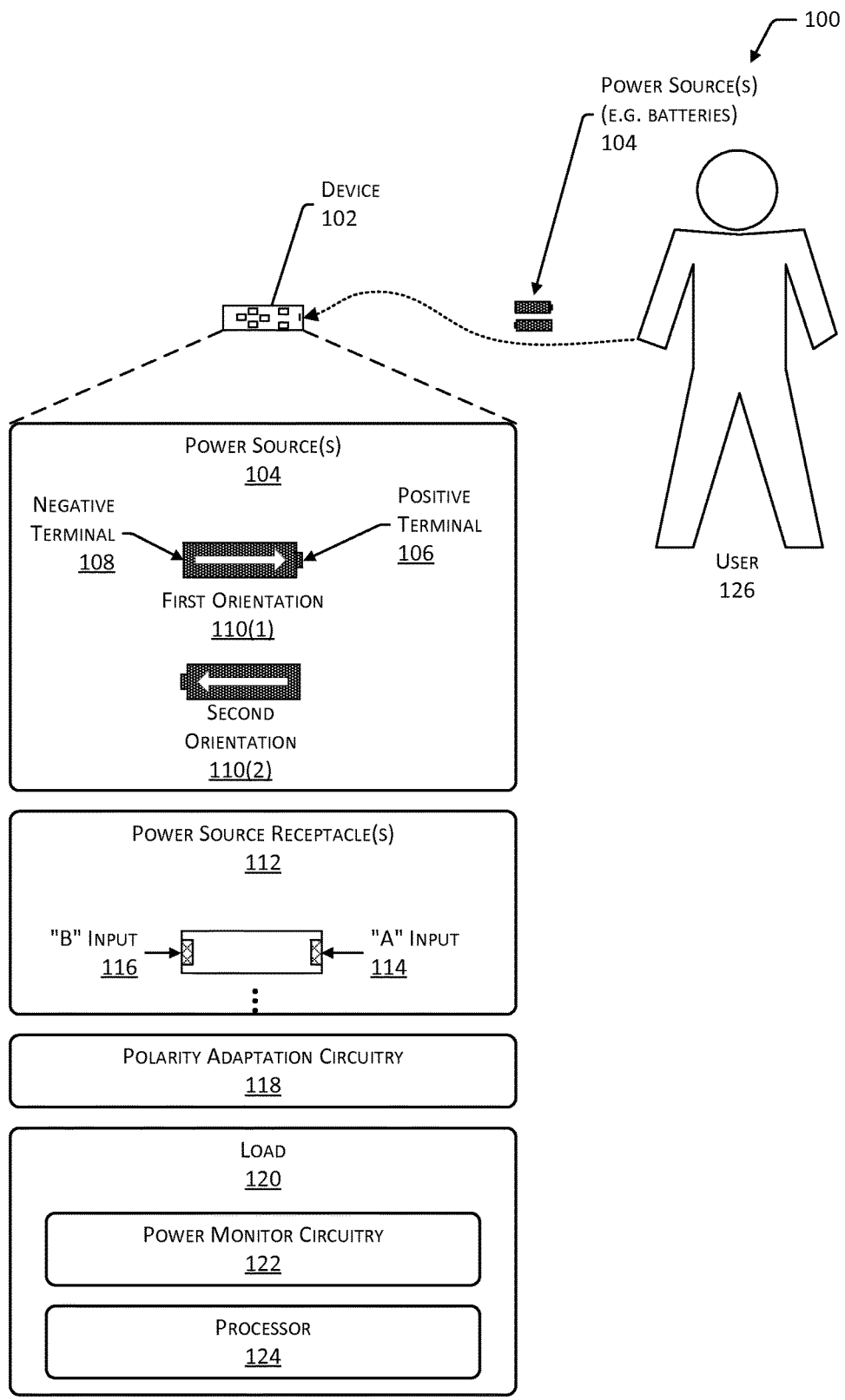
FIG. 1 is an illustrative system of a device using polarity adaptation circuitry to couple a power source in one or more power source receptacles to a load.

While implementations are described herein by way of example, those skilled in the art will recognize that the implementations are not limited to the examples or figures described. It should be understood that the figures and detailed description thereto are not intended to limit implementations to the particular form disclosed but, on the contrary, the intention is to cover all modifications, equivalents, and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION

Many devices use electrical power to operate, taking advantage of a flow of electric current from one point in a circuit to another to perform some work. Electrical power may be provided by a power source. Power sources may include, but are not limited to, primary batteries (non-rechargeable), secondary batteries (rechargeable), fuel cells, photovoltaic generators, thermoelectric generators, and so forth. The power source exhibits a polarity, that is, a positive and a negative output. By convention, electric current is described as flowing from the positive to the negative.

The devices using electrical power to operate may be portable such that they may be moved from one location to another or used while in motion. For example, portable devices may include remote controls, flashlights, tablet computers, smartphones, handheld radios, cardiac defibrillators, electric vehicles, and so forth. The devices may use portable power sources, such as batteries, or the devices may connect to a stationary power source, such as the electric grid.

The device, in particular the load comprising the circuitry that utilizes the electric power, may be configured to operate with power applied in a particular polarity. For example, the device may comprise solid-state circuitry that requires current to flow in a particular direction. Application of electric power with an incorrect polarity relative to the load may result in the load being nonfunctional or damaged. For example, loading batteries into a handheld radio without regard for the intended polarity of the device may damage electronic components within.

Traditionally, connections between the power source and the load of the device may have been protected from incorrect polarization by way of mechanical mechanisms. For example, a battery receptacle may be configured to accept a battery and establish electrical configuration only when installed with the correct polarization. In another example, connectors between the power source and load may be keyed to prevent an incorrect polarized connection. These and other traditional techniques may prevent damage to the load from this incorrect polarization but may also leave the device in an inoperable state. Continuing the example, the user may insert batteries into the battery receptacle with incorrect polarization preventing the load from operating. While preventing damage to the load, this may result in an adverse user experience.

Furthermore, in some situations, the physical form factor of the battery receptacle or the battery may be such that it is infeasible or difficult to specify a polarity to the user. For example, a small form factor device such as a hand-held remote control may have limited space upon which to affix a label or legend to indicate a proper orientation of the batteries for installation. Continuing the example, orientation instructions printed on a cover of the battery compartment or within the battery receptacle therein may be difficult for the user to read.

In some situations, the power source may be damaged due to unintentional charging. For example, when a first and second battery are in series with one another, electrolyte may leak from a first battery when inadvertently charged by a second battery. The leaking electrolyte may cause corrosion, health hazards, and other undesirable effects. The power source may also be damaged due to discharge below a threshold level. For example, a lithium ion rechargeable battery may be damaged when discharged below a particular voltage.

Described in this disclosure is polarity adaptation circuitry configured to accept input regardless of polarity at the inputs and provide as output a specified particular polarity. The polarity adaptation circuitry may include one or more bridge circuits. Each bridge circuit is configured to accept electrical power from an "A" input and a "B" input and produce a positive output and a negative output. In one implementation, a power source receptacle or connector may be coupled to a bridge circuit. For example, the power source receptacle may comprise a battery holder with corresponding terminals to establish electrical contact with a battery installed therein. By using the polarity adaptation circuitry, the power source receptacle or power connector may be polarization insensitive, while still supporting operation of the device. For example, regardless of the orientation of the battery upon installation, the device will still operate.

In one implementation, the bridge circuit comprises four field-effect transistors (FETs). For ease of description, the FETs are designated Q1, Q2, Q3, and Q4. In some implementations, the FETs may comprise metal oxide semiconductors (MOS), also known as MOSFETs. Q1 and Q4 may comprise N-type FETs, each having a source, gate, and drain. Q2 and Q3 may comprise P-type FETs, each also having a source, gate, and drain. In this implementation, the A input is connected to the drains of Q1 and Q3 and the gates of Q4 and Q2. The B input is connected to the drains of Q4 and Q2 and the gates of Q1 and Q3. The sources of Q1 and Q4 are connected to the negative output of the bridge circuit, while the sources of Q3 and Q2 are connected to the positive output. The FETs are configured to exhibit a gate threshold voltage ($V_{GS}$) corresponding to the power source in use. For example, the gate threshold voltage may be configured to be above a minimum discharge threshold for a battery. In one implementation, FETs having a gate threshold voltage less than or equal to a minimum working voltage of a power source.

During operation, the FETs Q1, Q2, Q3, and Q4 serve to control the flow of electric current such that regardless of the polarity across the A and B inputs, a preset output polarity is provided. When substantial current is flowing through Q1 and Q2, substantial current is not flowing through Q3 and Q4. For example, the substantial current may comprise current greater than a gate-to-source leakage current of the FET.

The polarity adaptation circuitry may include a plurality of bridge circuits connected in parallel or in series with one another. For example, two bridge circuits may be connected in series to provide an increased output voltage as compared to a single bridge circuit.

The polarity adaptation circuitry may be incorporated into a device with an internal load, or the polarity adaptation circuitry may be used in the form of an adapter or dongle configured to accept input power of variable or unknown polarity and provide a predetermined or specific output polarity.

By utilizing the techniques described in this disclosure, devices may be constructed that are able operate when receiving electrical power of unknown polarity or variable polarity from a power source. For example, regardless of how the user installs batteries within the battery receptacle, the device will still operate normally. As a result, the user experience may be improved.

FIG. 1 is an illustrative system of a device using polarity adaptation circuitry to couple a power source in one or more power source receptacles to a load. A device 102 is configured to use electrical power from one or more power sources 104. The device 102 may comprise a remote control, flashlight, tablet computer, smartphone, test equipment, communication equipment, medical equipment, navigation equipment, electric vehicle, and so forth. The device 102 may be portable or stationary during use.

The power source 104 may include, but is not limited to, primary batteries (non-rechargeable), secondary batteries (rechargeable), fuel cells, photovoltaic generators, thermoelectric generators, and so forth. The power source 104 may be configured to provide alternating current (AC) or direct current (DC) while operating. The power source 104 provides a positive terminal 106 and a negative terminal 108.

In this figure, the power source 104 comprises a battery with an asymmetrical form factor such that the positive terminal 106 presents a protuberance while the negative terminal 108 is flat or concave. For example, the battery may comprise a cell within an "AA" or "R6" form factor. The power source 104 may be used in a first orientation 110(1) or a second orientation 110(2), with the orientation being indicative of a relationship between the terminals of the power source 104 and a corresponding power source receptacle 112.

The power source receptacle 112 may comprise a holder, frame, latch, compartment, connector, or other structure configured to establish an electrical connection with the terminals of the power source 104. For example, the power source receptacle 112 may include electrically conductive contacts corresponding to an "A" input 114 and a "B" input 116. The power source receptacle 112 may be symmetrical such that the power source 104 may be connected in either the first orientation 110(1) or the second orientation 110(2). Continuing the example above where the power source 104 comprises a battery in the "AA" form factor, the battery may be inserted into the power source receptacle 112 with the positive terminal 106 to the right or to the left.

In some implementations, by using the devices described herein, the power source receptacles 112 may be manufactured less expensively compared to polarization or orientation 110 specific embodiments. For example, the terminals within the power source receptacle 112 may be identical in size and shape, reducing the number of different components on a bill of materials for the power source receptacle 112 or the device 102 as a whole. In another example, physical members such as ridges or barriers configured to prevent incorrect orientation 110 may be omitted from the power source receptacle 112, reducing design and fabrication costs.

In another implementation (not shown), the power source receptacle 112 may comprise a plug, connector, or other electrical interface configured to allow for coupling to the power source 104. In some implementations, the power source receptacle 112 may be palindromic, also known as "hermaphroditic", such that physically identical connectors may be coupled to one another. For example, a first palindromic connector may be configured to have a first conductor connected to the A input 114 and a second conductor connected to the B input 116 of the bridge circuit in the polarity adaption circuitry 118. The first palindromic connector may be configured to couple to a second palindromic connector, establishing a conductive pathway for electric power to flow. Examples of palindromic connectors include, but are not limited to, the hermaphroditic blade and receptacle connector line from Tyco Electronics Corporation, 3MT™ Link Connector 381 series from 3M Corporation, and so forth. In another implementation, the power source receptacle 112 may be unkeyed or unpolarized such that physical interconnection does not enforce a particular polarity.

The device 102 may include or be coupled to polarity adaptation circuitry 118. The polarity adaptation circuitry 118 is configured to connect to the A input 114 and the B input 116 of one or more power source receptacles 112. The polarity adaptation circuitry 118 is configured to accept electric current regardless of polarity and provide a positive output and a negative output. The polarity adaptation circuitry 118 may provide other benefits during use of the device 102. For example, installation of depleted power sources 104 such as exhausted batteries below a gate threshold voltage will not provide power to the load 120. As a result, nearly exhausted batteries may be prevented from partially activating the load 120 which may then shut down or fail to operate properly due to inadequate power. For example, the load 120 may be prevented from "bouncing" between an incompletely activate state and an inactive state. The polarity adaptation circuitry 118 may comprise one or more FETs configured into one or more bridge circuits. The polarity adaptation circuitry 118 is described in more detail below with regard to FIGS. 3-6.

A load 120 is configured to connect to the positive output and the negative output of the polarity adaptation circuitry 118 and utilize electrical power provided thereby. The load 120 may include, but is not limited to, processors, wireless communication devices, motors, actuators, sensors, computer readable storage media devices, or other electrical circuitry. In some implementations, the load 120 may be polarization specific such that application of incorrectly polarized electrical power may render the load 120 inoperative or damage the load 120.

The load 120 may include power monitor circuitry 122 configured to provide information indicative of the operation of the polarity adaptation circuitry 118, or portions thereof, such as one or more bridge circuits, individual FETs, and so forth. For example, the power monitor circuitry 122 may be configured to provide information indicative of the orientation 110 of the power source 104 associated with a particular power source receptacle 112. In another example, the power monitor circuitry 122 may be configured to provide information indicative of whether the power source 104 coupled to a particular power source receptacle 112 is providing electric current sufficient to activate the polarity adaptation circuitry 118 as described below.

The power monitor circuitry 122 may comprise one or more discrete electronic components, application specific integrated circuits, communication interfaces, and so forth. For example, the power monitor circuitry 122 may comprise a microcontroller and a serial peripheral interface (SPI) configured to provide information about the power adaptation circuitry 118 to a processor 124 within the device 102 or coupled to the device 102. The power monitor circuitry 122 may also include power conditioning, buck or boost circuitry, and so forth. For example, the power monitor circuitry 122 may comprise the MIC7400 as promulgated by Micrel Inc., of San Jose, Calif., USA. The power monitor circuitry 122 may be configured to couple to one or more of the components in the power adaptation circuitry 118 to receive signals or information therefrom. For example, the power monitor circuitry 122 may couple to FETs to determine whether the FET is "on" and providing a flow of current from a source to a drain or "off" and preventing a flow of current from the source to the drain.

The processor 124 may comprise a dedicated processor configured to control one or more portions of the device 102, an application processor configured to execute one or more general-purpose applications, and so forth. For example, the processor 124 may comprise a microprocessor using technology from Intel of Santa Clara, Calif., USA; ARM Holdings PLC of Cambridge, England, United Kingdom; Freescale Semiconductor Inc. of Austin, Tex., USA, and so forth.

By using the techniques described herein, a user 126 may install or couple one or more power sources 104 to the device 102 without regard to the orientation 110 thereof with respect to the power source receptacles 112. For example, the user 126 is able to install batteries within a remote control without the need to follow particular orientation instructions. As a result, the experience of the user 126 may be improved, potential damage to one or more of the device 102 or the power source(s) 104 is avoided, and so forth.

Figure 2:
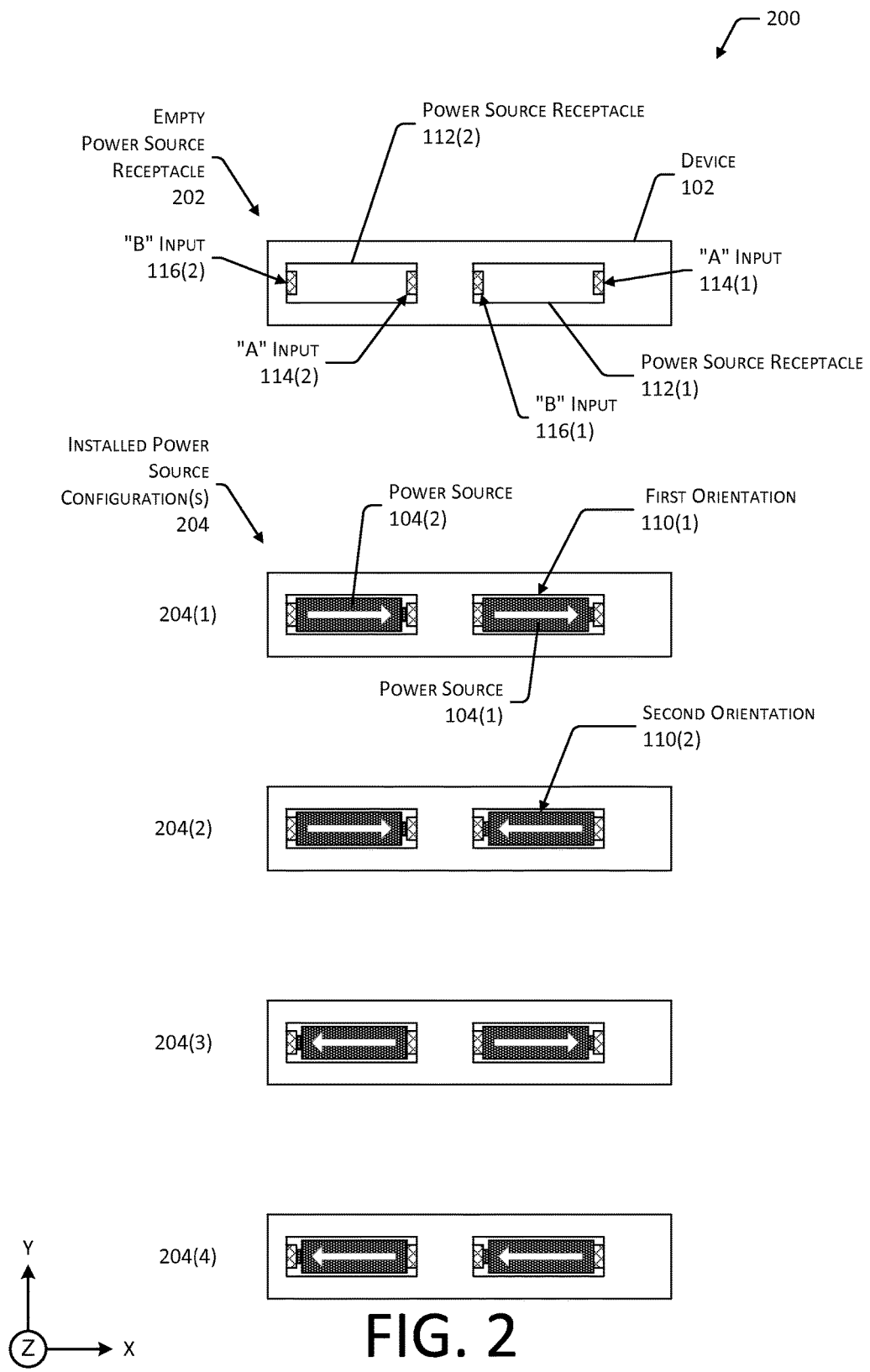
FIG. 2 illustrates one implementation of the power source receptacles and various orientations the power source may be installed therein.

FIG. 2 illustrates one implementation 200 of the power source receptacles 112, and various orientations 110 of the power source 104 may be installed therein. An empty power source receptacle 202 is depicted as having two power source receptacles 112(1) and 112(2) in a generally tandem configuration lengthwise along the device 102. The power source receptacle 112(1) has an A input 114(1) and a B input 116(1), while the power source receptacle 112(2) has an A input 114(2) and a B input 116(2). In other implementations, the power source receptacles 112(1) and 112(2) may be arranged in other configurations. The positioning of the A input 114 and the B input 116 with regard to the power source receptacle 112 may vary from that depicted here. For example, placement of the A input 114(1) and the B input 114(1) in the power receptacle 112(1) may be swapped. Similarly, the positioning of the A input 114 and the B input 116 from one power receptacle 112 to another may also vary.

Installed power source configurations 204(1) through 204(4) depict the various permutations in which the power sources 104 may be installed. For example, the first power source configuration 204(1) depicts both power sources 104(1) and 104(2) in the first orientation 110(1). In comparison, the third power source configuration 204(3) depicts the first power source 104(1) in the first orientation 110(1) while the second power source 104(2) is in the second orientation 110(2). Regardless of the respective orientation 110 of the power source 104 in a given power source receptacle 112, the polarity adaptation circuitry 118 delivers electrical power of a predetermined polarity. As a result, for any and all of the installed power source configurations 204(1) through 204(4) depicted, the load 120 of the device 102 operates normally.

Figure 3:
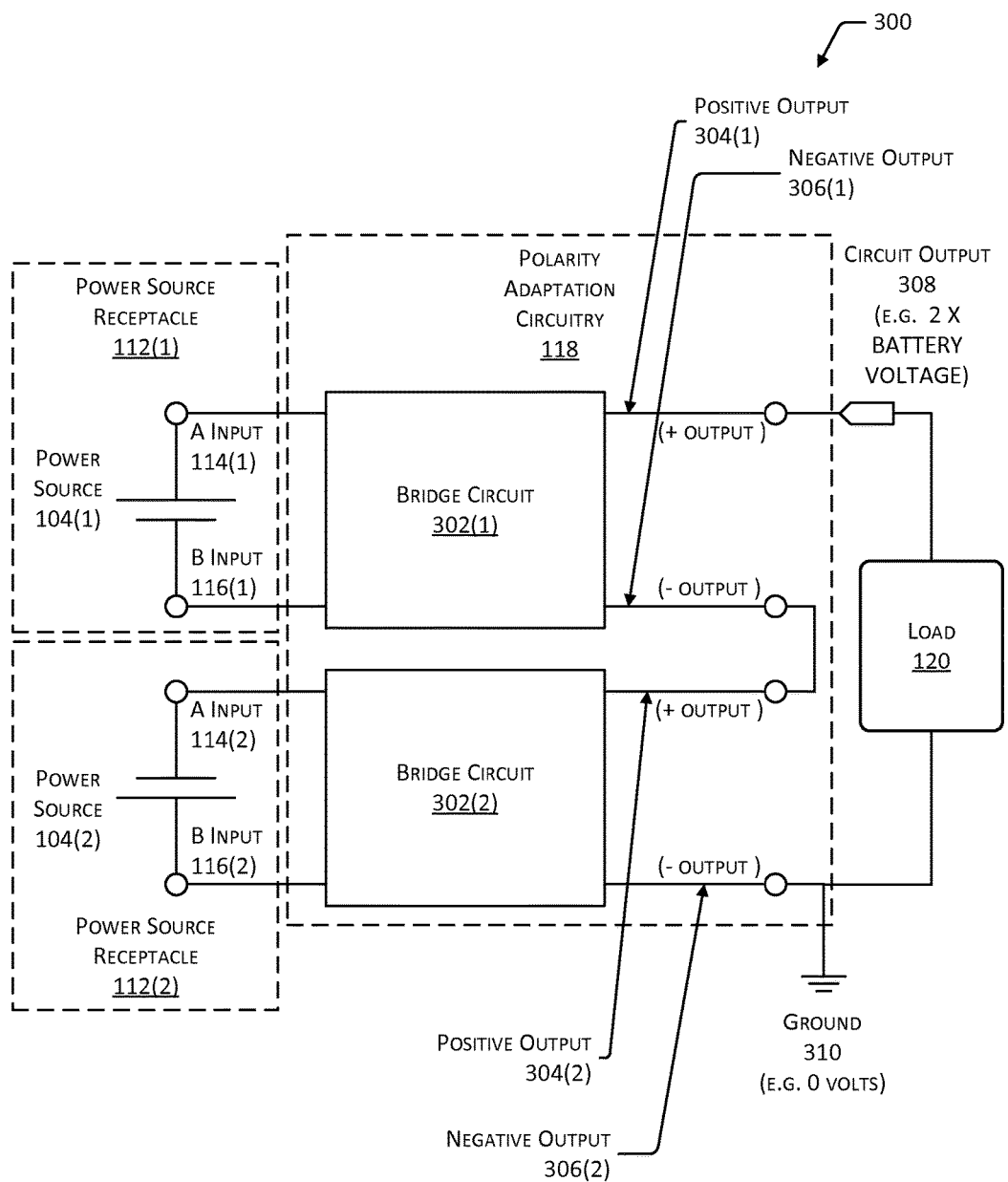
FIG. 3 illustrates a block diagram of one implementation of the polarity adaptation circuitry using multiple bridge circuits with multiple power sources.

FIG. 3 illustrates a block diagram 300 of one implementation of the polarity adaptation circuitry 118 using multiple bridge circuits with multiple power sources 104. For example, the device 102 described above with regard to FIG. 2 may implement the circuitry depicted here.

In some implementations, a plurality of power sources 104 may be used to provide power to the load 120. For example, additional power sources 104 may be connected in series to provide increased voltage, may be connected in parallel to provide increased current, or a combination thereof. In this illustration, two power sources 104(1) and 104(2) are present, each having their respective A inputs 114 and B inputs 116 connected to their respective power source 104. Each pair of A input 114 and B input 116 is coupled to a bridge circuit 302. For example, the A input 114(1) and B input 116(1) provide input to a first bridge circuit 302(1), while the A input 114(2) and B input 116(2) provide input to a second bridge circuit 302(2).

Each bridge circuit 302 provides a positive output 304 and a negative output 306. For example, the bridge circuit 302(1) has a positive output 304(1) and a negative output 306(1), while the bridge circuit 302(2) has a positive output 304(2) and a negative output 306(2). Regardless of the polarity across the A input 114 and the B input 116, the positive output 304 remains positive and the negative output 306 remains negative.

The bridge circuit 302(1) is connected in series with the bridge circuit 302(2) such that the negative output 306(1) of the first bridge circuit 302(1) is connected to the positive output 304(2) of the second bridge circuit 302(2). The positive output 304(1) thus provides the circuit output 308 while the negative output 306(2) may be connected to ground 310. For example, where the power sources 104(1) and 104(2) comprise single-cell batteries each with an individual cell voltage of 1.2 volts, the circuit output 308 is approximately 2.4 volts relative to the ground 310. The load 120 may be coupled to the circuit output 308 and the ground 310 to draw electrical power for use.

In other implementations, additional bridge circuits 302 (B) may be added in series in a similar fashion to provide circuit output 308 of a desired voltage. Letter within parenthesis, such as "(B)" may be indicative of an integer value. Continuing the example, should the load 120 be designed for operation at 3.6 V, a third power source 104(3) and corresponding third bridge circuit 302(3) may be added in series.

Figure 4:
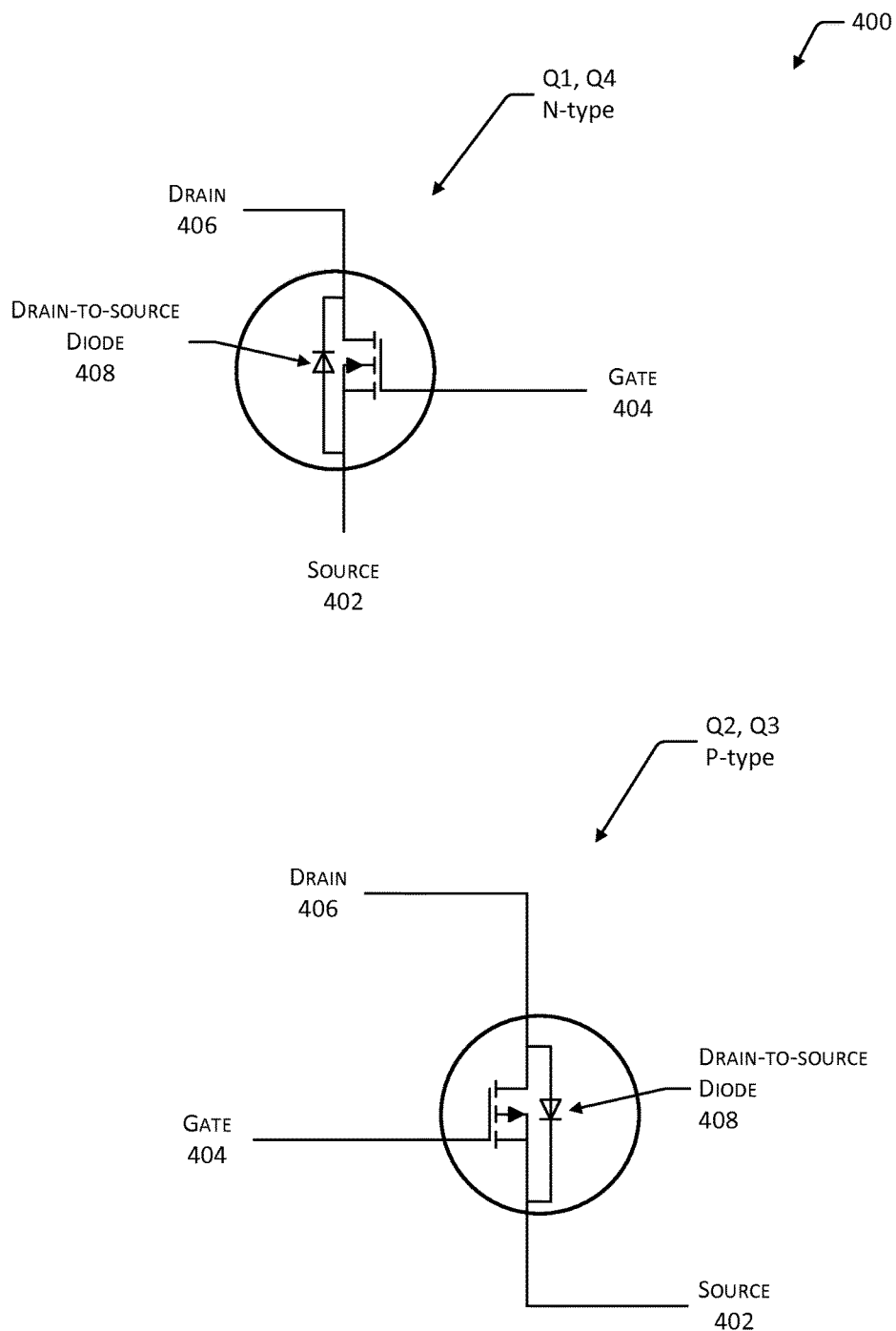
FIG. 4 illustrates field-effect transistors and their respective components.

FIG. 4 illustrates field-effect transistors (FETs) 400 and their respective components that may be used in the bridge circuit 302 of the polarity adaptation circuitry 118. FETs Q1 and Q4 comprise an N-type semiconductor device while Q2 and Q3 comprise a P-type semiconductor device. Each FET includes a source 402, gate 404, and a drain 406. The FET may include a drain-to-source diode 408 or other components. In some implementations, charge carriers such as electrons resulting from a flow of electric current, enter the FET at the source 402 and leave the FET at the drain 406, as controlled by voltage applied to the gate 404. Thus, voltage at the gate 404 directs how many charge carriers (current) may flow from the source 402 to the drain 406. For the N-type FETs, a positive voltage at the gate 404 results in current flow from the source 402 to the drain 406. In contrast, for the P-type FETs, a negative voltage at the gate 404 results in current flow from the source 402 to the drain 406.

The FETs are configured to exhibit a gate threshold voltage ($V_{GS}$) corresponding to the power source 104 in use. The gate threshold voltage specifies the minimum voltage that, when applied to the gate 404 (and relative to the source 402), allows for conduction of charge carriers and thus the transfer of current within the FET from the source 402 to the drain 406. In effect, the gate threshold voltage specifies the minimum voltage that will turn the FET "on".

The gate threshold voltage may be configured to be above a minimum discharge voltage or threshold for a power source 104, such as a battery. Discharge of the power source 104 below the minimum discharge voltage may result in damage to the power source 104. For example, a lithium polymer battery may sustain damage when discharged below a minimum discharge voltage of 2.9 V. The gate threshold voltage may be configured such that the bridge circuit 302 will disconnect the power source 104 from the load 120 when the power source 104 presents a voltage across the "A" input 114 and the "B" input 116 that is below the minimum discharge voltage. As a result, the bridge circuit 302 may protect the power source 104 from damage.

The configuration of the gate threshold voltage may be made by way of particular parts selection, semiconductor selection or configuration within the FET, and so forth. In one implementation, FETs having a gate threshold voltage greater than or equal to a minimum discharge voltage may be selected. In another implementation, the FETs may have a gate threshold voltage that is less than or equal to a minimum working voltage of a power source. For example, for use with a power source such as nickel-metal hydride or alkaline batteries that exhibit a typical cell operating voltage of about 1.2 V, the gate threshold voltage may be 1.2 V or less. In some implementations the gate threshold voltage of the FETs may be at least 0.4 volts.

The minimum working voltage of the power source 104 may be the lowest voltage at which the power source 104 is able to provide a particular current to the load 120. In another example, the minimum working voltage may comprise a lowest voltage at which the load 120 is able to operate as intended. In other implementations, the gate threshold voltage of the FETs may be selected to correspond to the design requirements appropriate to the power source 104, the load 120, or both. The FETs may also be configured to exhibit a drain-to-source on-resistance ($R_{DS(on)}$) of less than 250 milliohms.

The FETs may comprise metal oxide semiconductors (MOS), polycrystalline silicon semiconductors, and so forth. In one implementation, the FETs may comprise power MOSFETs from ON Semiconductor of Phoenix, Ariz., USA. For example, Q1 and Q4 may comprise power MOSFETs ON Semiconductor part number NTLJD4116N while Q2 and Q3 may comprise power MOSFETs ON Semiconductor part number NTUD3115P. Other semiconductor devices such as an insulated-gate field effect transistor (IGFET) or metal-insulator-semiconductor FETs (MISFETs) may be used instead of, or in addition to, MOSFETs.

In other implementations, other semiconductor devices may be used in a similar fashion. For example, bipolar junction transistors (BJTs) may also be used instead of, or in addition to, FETs. FETs may be preferred for use in some implementations, such as where the power source 104 has a relatively low output voltage. The relatively low voltage drop across the FET, as compared to the BJTs or other semiconductor devices, may improve performance or support operation of the polarity adaptation circuitry 118 in these implementations. For example, where the power source 104 comprises one or more battery cells and is configured to provide a maximum cell output voltage of about 2 V, the low drain-to-source on-resistance $R_{DS(on)}$ of the FET still provides a usable output voltage to the load 120. As a result, use of the bridge circuit 302 that utilizes FETs allows the polarity adaptation circuitry 118 to operate and be useful in low-voltage situations.

In another implementation, the bridge circuit 302 may utilize one or more opto-isolators. For example, the bridge circuit 302 may comprise one or more solid-state relays comprising one or more photodiodes driving MOSFETs or an insulated-gate bipolar transistor (IGBP).

Figure 5:
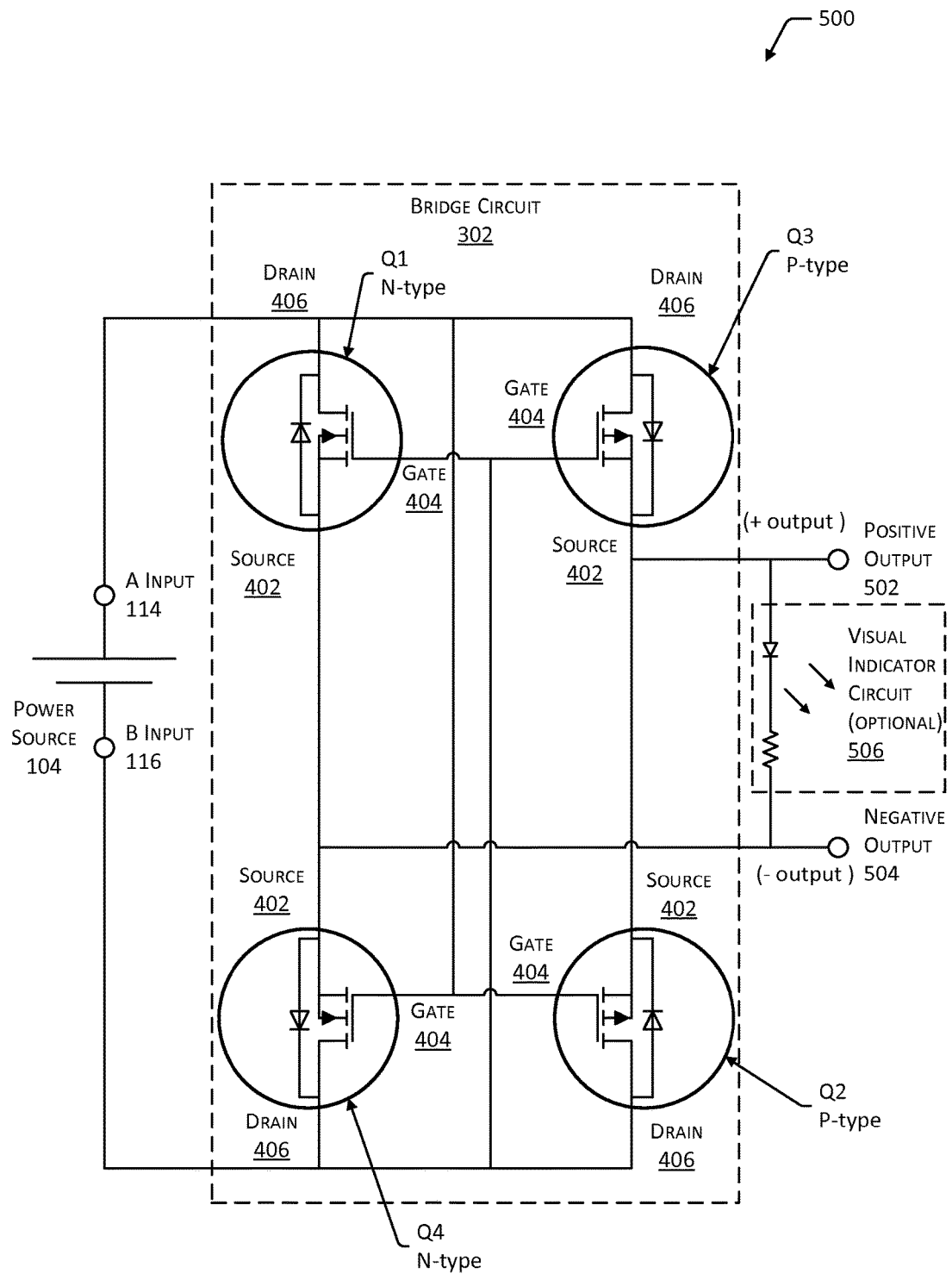
FIG. 5 illustrates one implementation of the bridge circuit.

FIG. 5 illustrates one implementation 500 of the bridge circuit 302. As described above, the polarity adaptation circuitry 118 may include one or more bridge circuits 302. The bridge circuit 302 includes an A input 114 and a B input 116. Regardless of the polarity applied by the power source 104 across the A input 114 and the B input 116, the bridge circuit 302 delivers consistent polarity at a positive output 502 and a negative output 504.

The bridge circuit 302 includes four FETs designated Q1, Q2, Q3, and Q4. As described above, these may comprise FETs, MOSFETs, IGFETs, MISFETs, and so forth. Q1 and Q4 comprise N-type FETs. Q2 and Q3 comprise P-type FETs. As described above, each FET has a source 402, gate 404, and drain 406.

The A input 114 is connected to the drains 406 of Q1 and Q3 and the gates 404 of Q4 and Q2. The B input 116 is connected to the drains 406 of Q4 and Q2 and the gates 404 of Q1 and Q3. The sources 402 of Q1 and Q4 are connected to the negative output 504. The sources 402 of Q3 and Q2 are connected to the positive output 502.

In this illustration, the power source 104 is connected such that the positive terminal of the power source 104 is coupled to the A input 114 while the negative terminal of the power source 104 is coupled to the B input 116. In this configuration, the positive voltage applied to the A input 114 provides sufficient voltage to the gate 404 of the Q4 N-type FET to allow current to flow from the source 402 to the drain 406, in effect, turning FET Q4 "on". Similarly, the negative voltage applied to the B input 116 provides sufficient voltage to the gate 404 of the Q3 P-type FET to allow current to flow from the source 402 to the drain 406, in effect turning FET Q3 "on". FETs Q1 and Q2 have insufficient or oppositely biased voltages applied to their respective gates 404, and thus remain "off", preventing current flow between their respective sources 402 and drains 406. Should the power source 104 be connected with polarity opposite to that illustrated, the opposite situation would occur, with FETs Q1 and Q2 being "on" and Q3 and Q4 being "off". As a result, regardless of the polarity of the power source 104, positive output 502 remains positive and the negative output 504 remains negative.

The bridge circuit 302 may prevent inadvertent discharge of the power source 104 below a threshold level. Deep discharge of certain battery chemistries may result in damage to battery cells. For example, discharge of a lithium ion cell below a threshold voltage may render the cell unsuitable or unsafe for recharging by resulting in undesired metal plating of internal structures of the cell. The bridge circuit 302 may be configured such that the gate threshold voltage is greater than or equal to the minimum voltage of the cell. Continuing the example, where the power source 104 comprises lithium ion batteries having a minimum recharge voltage of 2.4 V, the FETs may be selected to manifest a gate threshold voltage of 2.5 V. As a result, when the voltage provided by the batteries drops below the gate threshold voltage, the bridge circuit 302 will disconnect the battery from the load 120 before reaching the minimum recharge voltage of 2.4 V, preventing damage to the cells therein.

The bridge circuit 302 may also prevent activation of the load 120 when the power source(s) 104 is insufficient to reliably support operation thereof. For example, installation of a depleted battery exhibiting an output voltage of less than 0.7 V into the power source receptacle 112 is insufficient to activate the FETs of the bridge circuit 302. As a result, the load 120 is not subjected to annoying or potentially damaging incomplete activations. For example, a depleted battery may be sufficient to energize at least a portion of the load 120, but subsequent power demands by the load 120 may result in insufficient power delivery that in turn results in the load 120 shutting down unexpectedly. As a result, the load 120 may "bounce" or oscillate between off and on states.

In some implementations, an indicator or status circuit may be included with the bridge circuit 302 or coupled to the positive output 502 and the negative output 504. The indicator circuit may be configured to provide information about status of the power source 104 or overall operation of the bridge circuit 302. A visual indicator circuit 506 is illustrated comprising a light emitting diode (LED) and a resistor connected to the positive output 502 and negative output 504. Upon connection of a power source 104 sufficient to activate the bridge circuit 302, such as having an output voltage above the gate threshold voltage, the LED light may provide a visual indicator to the user 126 that the power source 104 contains at least some power. This visual indication may improve the user experience by allowing the user 126 to readily determine if the power source 104 such as a battery is exhausted and needs to be replaced. In some implementations, additional circuitry may be added to provide additional functions, such as deactivating the LED after some time has elapsed.

In other implementations, the indicator circuit (such as the visual indicator circuit 506) may be configured to provide a visual indicator that the power source 104 connected thereto is insufficient and not providing power at the positive output 502 and the negative output 504. For example, an LED may be lit to indicate that the battery inserted into the power source receptacle 112 is exhausted and needs to be replaced. During operation, this indicator circuit may draw power from another source such as capacitor, another bridge circuit 302, and so forth.

In other implementations, instead of, or in addition to, visual indicia, other indicators may be provided. For example, audible indicia such as a sound from a speaker or buzzer or haptic output such as a vibrotactile sensation may be provided to the user 126. In other implementations, the bridge circuit 302, or portions thereof, may be coupled to the power monitor circuitry 122 to provide information indicative of operation of the bridge circuit 302. The information may be provided to the processor 124 by way of a communication interface or bus. The processor 124 may provide a user interface, such as on a display screen or via other indicators, to the user 126. The information 124 may also be provided to other applications or processes executing on or in conjunction with the processor 124.

Figure 6:
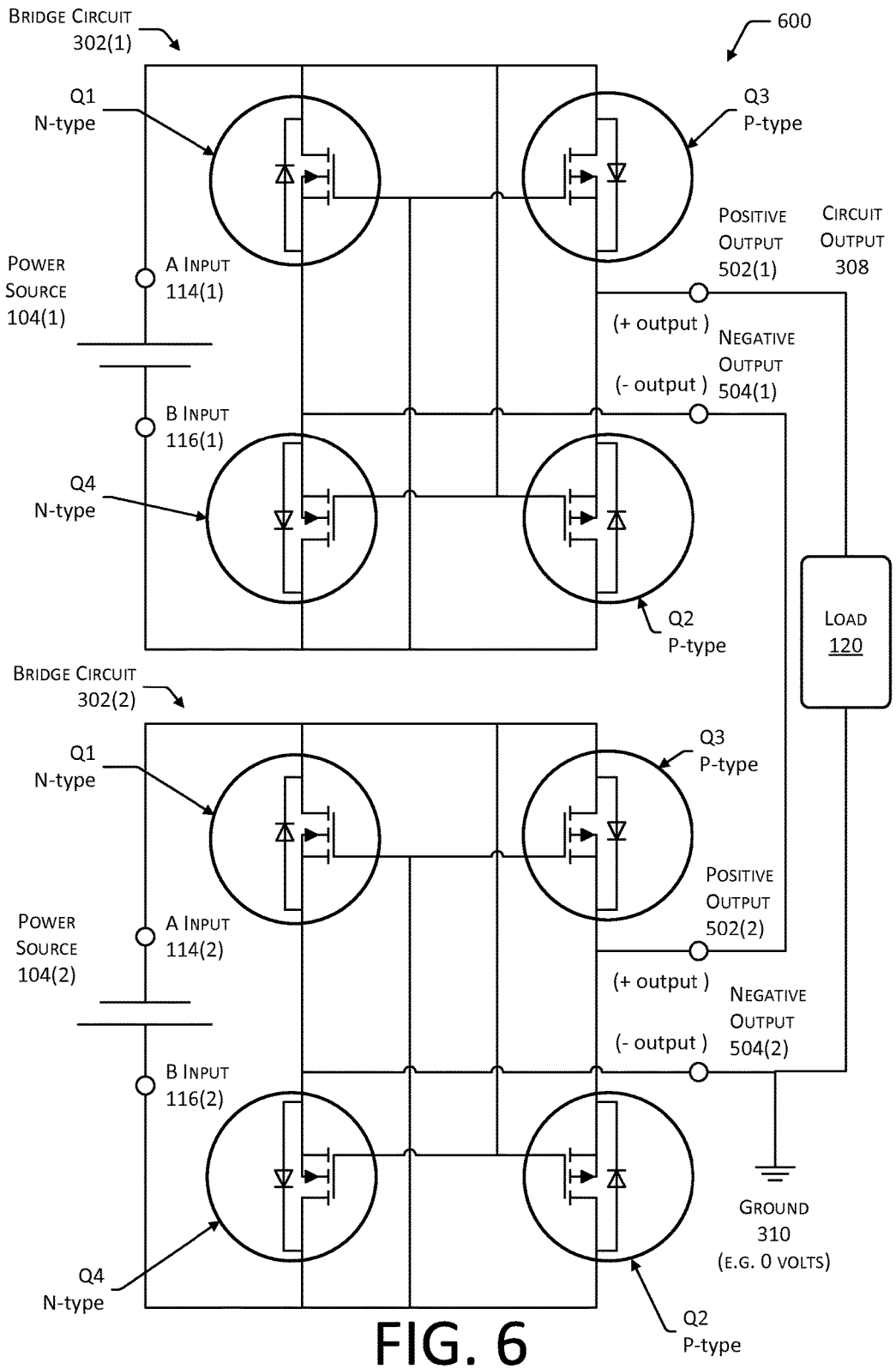
FIG. 6 illustrates another implementation of the power adaptation circuitry including two bridge circuits for use with two power sources.

FIG. 6 illustrates another implementation 600 of the power adaptation circuitry 118 including two bridge circuits 302 for use with two power sources 104. As described above with regard to FIG. 3, a plurality of bridge circuits 302 may be connected in series, parallel, or both with one another to provide various output voltages and currents suitable for the load at 120.

In this illustration, positive output 502(1) of the first bridge circuit 302(1) is provided as the circuit output 308 to which the load 120 may be connected. A negative output 504(1) of the first bridge circuit 302(1) is connected to a positive output 502(2) of the second bridge circuit 302(2). A negative output 504(2) of the second bridge circuit 302(2) is connected to the ground 310 to which the load 120 may also be connected. As a result of the series interconnection between the first bridge circuit 302(1) and the second bridge circuit 302(2), the voltage across the circuit output 308 and the ground 310 is approximately the sum of the voltage of the first power source 104(1) and the second power source 104(2), less internal losses of the polarity adaptation circuitry 118. For example, a voltage drop may occur across each of the active FETs due to the internal drain-to-source on-resistance $R_{DS(on)}$ thereof.

Although the present invention has been described in considerable detail with reference to certain preferred embodiments thereof, the disclosure is not intended to limit scope of the disclosure. Persons having ordinary skill in the art may make various modifications and changes without departing from the scope. Therefore, the scope of the appended claims should not be limited to the description of the preferred embodiments described above. Rather, the specific features and devices are disclosed as exemplary forms of implementing the claims.

What is claimed is:

1. A device comprising:
  a battery receptacle comprising a first contact and a second contact configured to electrically couple to a battery in either a first orientation or a second orientation with respect to polarity of the battery;
  a bridge circuit connected to the first contact and the second contact and having a positive output and a negative output, the bridge circuit comprising:
    four metal oxide semiconductor field-effect transistors (MOSFETs) Q1, Q2, Q3, and Q4, wherein:
    the Q1 and the Q4 comprise N-type MOSFETs each having a source, gate, and drain;
    the Q2 and the Q3 comprise P-type MOSFETs each having a source, gate, and drain;
    the first contact is connected to the drains of the Q1 and the Q3 and the gates of the Q4 and the Q2;
    the second contact is connected to the drains of the Q4 and the Q2 and the gates of the Q1 and the Q3;
    the sources of the Q1 and the Q4 are connected to the negative output; and
    the sources of the Q2 and the Q3 are connected to the positive output.

2. The device of claim 1, wherein the four MOSFETs are configured to exhibit a gate threshold voltage ($V_{GS}$) less than or equal to a minimum working voltage of the battery.

3. The device of claim 1, wherein:
  the battery receptacle comprises a first receptacle;
  the bridge circuit comprises a first bridge circuit;
  the positive output comprises a first positive output;
  the negative output comprises a first negative output; and
  the device further comprising:
    a second receptacle connected to a second bridge circuit; and
  wherein:
    the first negative output of the first bridge circuit is connected to a second positive output of the second bridge circuit; and
    the first positive output and the second negative output are configured to connect to a load.

4. The device of claim 1, further comprising:
  power monitor circuitry configured to provide information indicative of operation of one or more of the Q1, the Q2, the Q3, or the Q4 to a processor.

5. A device comprising:
  a bridge circuit having a first input, a second input, a first output, and a second output, the bridge circuit comprising:
    a first field-effect transistor (FETs), a second FET, a third FET, and a fourth FET fourth FET; wherein:
    the first FET and the fourth FET comprise FETs each having a source, a gate, and a drain, wherein the first FET and the fourth FET comprise N-type FETs;
    the second FET and the third FET comprise FETs each having a source, a gate, and a drain, wherein the second FET and the third FET comprise P-type FETs;
    the first input is connected to:
      the drains of the first FET and the third FET, and
      the gates of the second FET and the fourth FET;
    the second input is connected to:
      the drains of the second FET and the fourth FET, and
      the gates of the first FET and the third FET;
    the sources of the first FET and the fourth FET are connected to the second output; and
    the sources of the second FET and the third FET are connected to the first output.

6. The device of claim 5, wherein the FETs comprise semiconductor materials configured to exhibit a gate threshold voltage ($V_{GS}$) of at least 0.4 Volts (V).

7. The device of claim 5, further comprising:
  a receptacle connected to the first input and the second input of the bridge circuit, the receptacle configured to couple to a power source in a plurality of physical orientations.

8. The device of claim 5, the power source comprising one or more battery cells configured to provide a maximum cell output voltage of 2 volts across the first input and the second input.

9. The device of claim 5, further comprising a first palindromic connector having a first conductor connected to the first input and a second conductor connected to the second input of the bridge circuit, wherein the first palindromic connector is configured to couple to a second palindromic connector.

10. The device of claim 5, further comprising an indicator circuit coupled to the first output and the second output, the indicator circuit configured to provide one or more of an audible or a visual indication that the bridge circuit is or is not providing power at the second output and the first output.

11. The device of claim 5, further comprising:
  power monitor circuitry configured to provide, to a processor, information indicative of operation of one or more of the first FET, the second FET, the third FET, or the fourth FET of the bridge circuit.

12. A device comprising:
  a first field effect transistor (FET) and a second FET, each having a source, gate, and a drain, wherein the first FET and the second FET comprise N-type FETs;
  a third FET and a fourth FET, each having a source, gate, and a drain, wherein the third FET and the fourth FET comprise P-type FETs;
  a first input connected to the drains of the first FET and the fourth FET and the gates of the second FET and the third FET; and
  a second input connected to the drains of the second FET and the third FET and the gates of the first FET and the fourth FET;
  wherein:
    the sources of the first FET and the second FET are connected to a negative output; and
    the sources of the third FET and the fourth FET are connected to a positive output.

13. The device of claim 12, wherein the FETs are configured to exhibit a gate threshold voltage ($V_{GS}$) greater than or equal to a minimum discharge voltage of a power source.

14. The device of claim 12, wherein the FETs comprise semiconductor materials configured to exhibit a gate threshold voltage ($V_{GS}$) of at least 0.4 Volts (V).

15. The device of claim 12, wherein the FETs are configured to exhibit a drain-to-source on-resistance ($R_{DS(on)}$) of less than 250 milliohms.

16. The device of claim 12, further comprising:
  power monitor circuitry configured to provide information indicative of operation of one or more of the first FET, the third FET, the fourth FET, or the second FET to a processor.

17. The device of claim 12, further comprising a battery receptacle configured to establish electrical contact with a battery in a plurality of orientations; wherein a first terminal of the battery receptacle connects to the first input and a second terminal of the battery receptacle connects to the second input.

18. The device of claim 12, further comprising a connector configured to establish electrical contact between a power source and the first input and the second input.

19. The device of claim 12, further comprising a first palindromic connector having a first conductor connected to the first input and a second conductor connected to the second input, wherein the first palindromic connector is configured to couple to a second palindromic connector.

20. The device of claim 12, further comprising an indicator circuit coupled to the negative output and the positive output, the indicator circuit configured to provide one or more of an audible or a visual indication that the bridge circuit is one or more of: providing power or not providing power, at the positive output and the negative output.

* * * * *